United States Patent
Chen et al.

(10) Patent No.: US 9,195,791 B2
(45) Date of Patent: Nov. 24, 2015

(54) CUSTOM MODULE GENERATION (75) Inventors: Haichun Chen, Sunnyvale, CA (US);
Greg Woolhiser, San Jose, CA (US);
Scott I. Chase, Pleasanton, CA (US)

(73) Assignee: SYNOPSYS, INC., Mountain View, CA (US)

(*) Notice: Subject to any disclaimer, the term of this patent is extended or adjusted under 35 U.S.C. 154(b) by 611 days.

(21) Appl. No.: 12/791,759

(22) Filed: Jun. 1, 2010

(65) Prior Publication Data

US 2011/0296364 A1 Dec. 1, 2011

(51) Int. Cl.
G06F 17/50 (2006.01)
H01L 27/02 (2006.01)

(52) U.S. Cl.
CPC ........ *G06F 17/5068* (2013.01); *H01L 27/0207* (2013.01)

(58) Field of Classification Search
None
See application file for complete search history.

(56) References Cited

U.S. PATENT DOCUMENTS

| | | | |
|---|---|---|---|
| 5,097,422 A * | 3/1992 | Corbin et al. | 716/52 |
| 5,210,701 A * | 5/1993 | Hana et al. | 716/114 |
| 5,278,769 A * | 1/1994 | Bair et al. | 703/19 |
| 5,351,197 A * | 9/1994 | Upton et al. | 716/120 |
| 5,463,563 A * | 10/1995 | Bair et al. | 716/104 |
| 6,519,191 B1 * | 2/2003 | Morishita | 365/189.09 |
| 7,243,317 B2 * | 7/2007 | Wang et al. | 716/112 |
| 7,331,029 B2 * | 2/2008 | Amit et al. | 716/113 |
| 7,418,683 B1 * | 8/2008 | Sonnard et al. | 716/122 |
| 7,543,262 B2 * | 6/2009 | Wang et al. | 716/119 |
| 2007/0130553 A1 * | 6/2007 | Wang et al. | 716/11 |
| 2011/0107281 A1 * | 5/2011 | Sun et al. | 716/106 |

* cited by examiner

*Primary Examiner* — A. M. Thompson (74) *Attorney, Agent, or Firm* — Park, Vaughan, Fleming & Dowler LLP; Laxman Sahasrabuddhe (57) ABSTRACT

Some embodiments of the present invention create a layout for a circuit design which includes one or more circuit modules. The system can receive a nominal implementation of a circuit module, and a user-defined module generator capable of generating one or more custom implementations of the circuit module from an existing implementation of the circuit module. Next, the system can create the layout for the circuit design by executing the user-defined module generator on at least one processor to generate one or more custom implementations of the circuit module from the nominal implementation. The system can then use the one or more custom implementations of the circuit module in the layout.

15 Claims, 6 Drawing Sheets

CUSTOM MODULE GENERATION

BACKGROUND

1. Technical Field

This disclosure relates to electronic design automation (EDA). More specifically, this disclosure relates to methods and apparatuses for custom module generation.

2. Related Art

Integrated circuit design involves using EDA tools to create and manipulate circuit designs. A designer may use an EDA tool to create a schematic of an integrated circuit. The schematic may then be used by other EDA tools to simulate the operation of the integrated circuit, create a layout of the integrated circuit, etc. Specifically, a designer can use an EDA tool to perform placement and routing to create a layout for the integrated circuit.

Designers typically create design rules that a layout for a circuit design needs to satisfy to ensure that the circuit design manufactures and operates as desired. The design rules for analog, RF (Radio Frequency), and custom circuit designs are complex and can vary from one module to the next. Therefore, a designer often has to manually edit the layout to ensure that the layout complies with the design rules and achieves the designer's design intent. Unfortunately, manual editing of the layout is tedious and error prone.

SUMMARY

One embodiment of the present invention provides a system for creating a layout for a circuit design which includes one or more circuit modules. The system can receive a nominal implementation of a circuit module, and receive a user-defined module generator capable of generating one or more custom implementations of the circuit module from an existing implementation of the circuit module. Then, the system creates the layout for the circuit design by executing the user-defined module generator to generate one or more custom implementations of the circuit module from the nominal implementation. The system can then use the one or more custom implementations of the circuit module in the layout.

Specifically, the system can generate a custom implementation by modifying the nominal implementation so that the custom implementation satisfies a set of constraints, e.g., a set of design rules. Note that the system can generate multiple custom implementations, each with different properties. For example, the system can generate multiple custom implementations that have different areas and/or leakage powers.

During placement and routing, the system can select a custom implementation of the circuit module from the one or more custom implementations. The system can then instantiate the custom implementation of the circuit module in the layout. Specifically, in some embodiments, the global placement and routing engine determines where the circuit module is to be placed in the overall layout, and the user-defined module generator performs placement and routing within the circuit module.

The user-defined module generator can also provide interactive features which enable a user to fine tune the design manually. For example, the user-defined module generator can present an options window to a user via a graphical user interface (GUI). Next, the system can receive module generator options from the user via the options window. The system can then provide the module generator options to the user-defined module generator. Next, the user-defined module generator can modify the existing custom implementation in the layout in accordance with the module generator options that were provided by the user. The system can then display the modified custom implementation to the user via the GUI.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Figure 1:
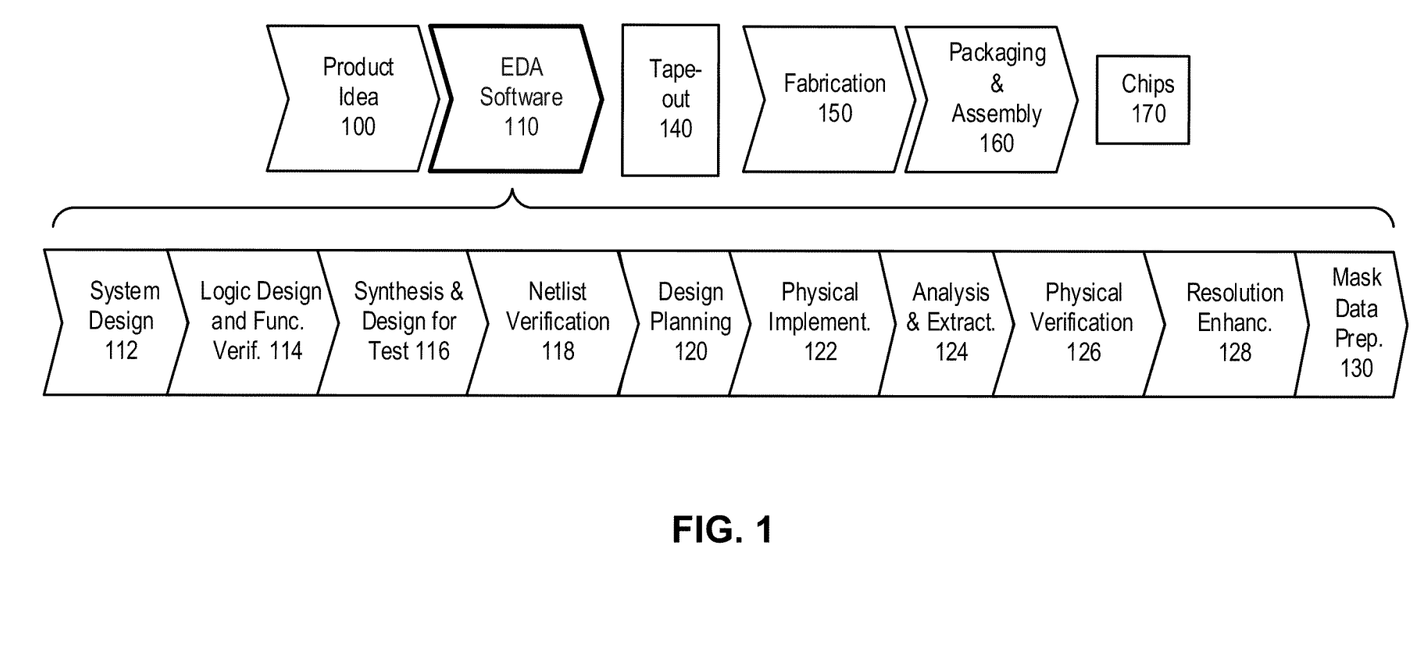
FIG. 1 illustrates various steps in the design and fabrication of an integrated circuit.

FIG. 1 illustrates various steps in the design and fabrication of an integrated circuit. The process starts with a product idea 100, which is realized using Electronic Design Automation (EDA) software 110. Chips 170 can be produced from the finalized design by performing fabrication 150 and packaging and assembly 160 steps.

A design flow that uses EDA software 110 is described below. Note that the design flow description is for illustration purposes only, and is not intended to limit the present invention. For example, an actual integrated circuit design may require a designer to perform the design flow steps in a different sequence than the sequence described below.

In the system design step 112, the designers can describe the functionality to implement. They can also perform what-if planning to refine the functionality and to check costs. Further, hardware-software architecture partitioning can occur at this step. In the logic design and functional verification step 114, a Hardware Description Language (HDL) design can be created and checked for functional accuracy.

In the synthesis and design step 116, the HDL code can be translated to a netlist, which can be optimized for the target technology. Further, in this step, tests can be designed and implemented to check the finished chips. In the netlist verification step 118, the netlist can be checked for compliance with timing constraints and for correspondence with the HDL code.

In the design planning step 120, an overall floor plan for the chip can be constructed and analyzed for timing and top-level routing. Next, in the physical implementation step 122, placement and routing can be performed.

In the analysis and extraction step 124, the circuit functionality can be verified at a transistor level. In the physical verification step 126, the design can be checked to ensure correctness for manufacturing, electrical issues, lithographic issues, and circuitry.

In the resolution enhancement step 128, geometric manipulations can be performed on the layout to improve manufacturability of the design. Finally, in the mask data preparation step 130, the design can be taped-out for production of masks to produce finished chips.

Embodiments of the present invention can be used in one or more of the above-described steps.

Figure 2:
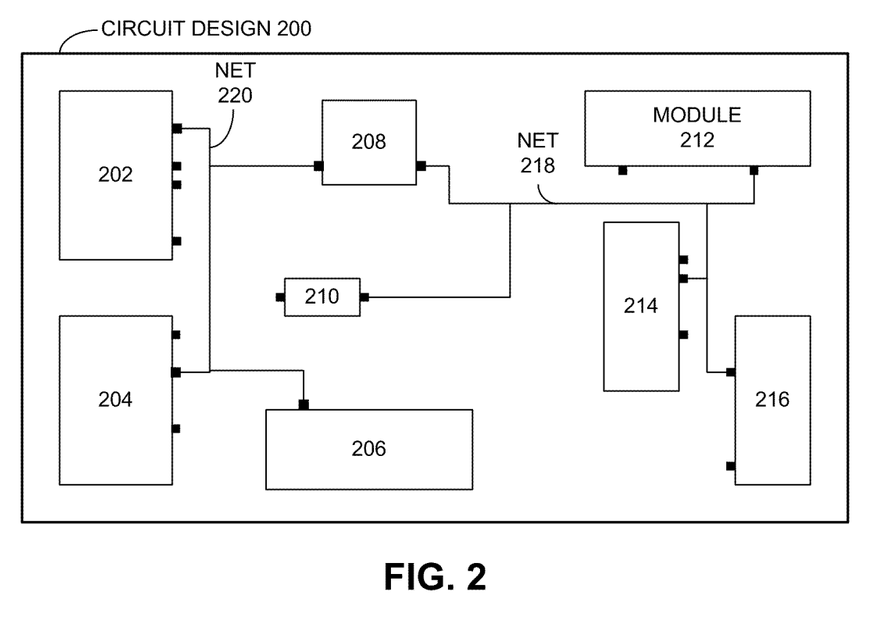
FIG. 2 illustrates an exemplary circuit layout in accordance with some embodiments of the present invention.

FIG. 2 illustrates an exemplary circuit layout in accordance with some embodiments of the present invention.

During placement and routing the system can receive a schematic which specifies the logical connectivity between the different modules. Next, the system can place modules and route wires to electrically couple the modules in accordance with the schematic. For example, circuit layout 200 includes a set of modules, e.g., modules 202-216, which have been electrically connected using wires as shown in FIG. 2. Specifically, net 220 electrically connects pins in modules 202-208, and net 218 electrically connects pins in modules 208-216.

Placement and routing can be performed using a bottom-up approach. In this approach, the system can first determine the layouts within circuit modules. Next, the system can place and route the circuit module layouts in the chip in accordance with the schematic.

The layout of the entire circuit design can be determined using a hierarchical approach. Specifically, once the layout within the circuit modules (e.g., logic gates) has been determined, the system can create larger circuit blocks (e.g., an 8-bit adder) based on the circuit module layouts. The system can then use these larger circuit blocks to create even larger circuit blocks (e.g., a processor), until the entire circuit design layout has been determined.

As mentioned above, designers typically create a set of constraints (e.g., a set of design rules) that need to be satisfied by a layout. In pure digital designs, the process of detecting and correcting design rule violations has been largely automated. However, design rules for analog, RF (Radio Frequency), and custom circuit designs are complex and can vary from one circuit module to the next. Therefore, in these designs, a designer often has to manually edit the layout to ensure that the layout complies with the design rules and achieves the designer's design intent. Unfortunately, manual editing of the layout is tedious and error prone.

Some embodiments of the present invention enable a user to provide a custom module generator which can manipulate an existing circuit module layout so that the modified circuit module layout satisfies a set of constraints, e.g., a set of design rules. Specifically, custom module generators can be used during a schematic-driven layout (SDL) process to generate custom modules for a chip design. During operation, a custom module generator can receive design constraints from a schematic design, along with schematic design information that is critical for generating a custom module implementation. Then, when used by a high-level place-and-route system that generates a layout for a chip design, the custom module generator can generate the custom layout for a module of the chip based in part on the design constraints and the schematic design information.

Some embodiments of the present invention provide a circuit layout system which enables a user to design a custom module generator that generates custom layouts for analog and/or mixed signal modules of a chip design, and enables the user to configure the custom module generator at runtime. A module generator can be derived from a logic representation of a functional module (e.g., a NAND, XOR, differential pair, or current mirror), and can implement (e.g., via circuit synthesis and/or placement and routing) the module in the target layout design so that it satisfies a set of constraints indicated by the schematic design and/or directly from the user.

The circuit layout system can include a GUI which facilitates modifying the layout of a circuit design at runtime. The GUI enables the user to indicate module generator options for optimizing a custom module during a placement and routing process. The system can also provide a runtime rendering mechanism for presenting a generated circuit layout to a user, thereby enabling the user to determine whether the layout is satisfactory.

If the user deems that the layout is not satisfactory, the user can use the GUI system to indicate or modify options for the custom generator that guide the custom generator toward generating a satisfactory layout for the custom module. For example, a user can provide additional design constraints that specify the user's design intent, such as by requiring that a pair of transistors in a module have matching dimensions. In response to the modified set of constraints, the module generator can produce a new custom module (e.g., by resizing transistors in the custom module as necessary to satisfy the constraints). Then, once the GUI system presents the user with a layout that the user deems is satisfactory, the user can commit the layout to the target layout design.

Figure 3:
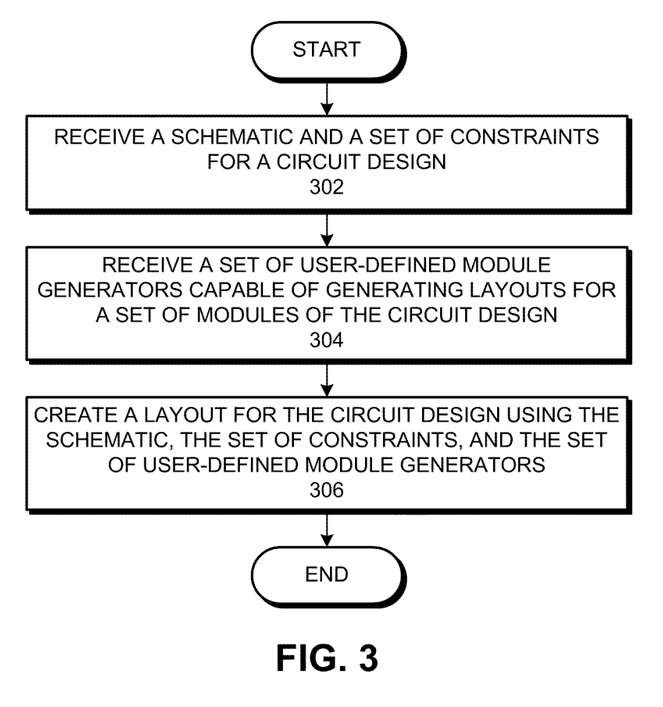
FIG. 3 presents a flow-chart illustrating a process for creating a layout for a circuit design in accordance with some embodiments of the present invention.

FIG. 3 presents a flow-chart illustrating a process for creating a layout for a circuit design in accordance with some embodiments of the present invention.

The process can be performed by a computer system which stores instructions and executes these instructions using a processor. The system can begin by receiving a schematic and a set of constraints for a circuit design (operation 302), and receiving a set of user-defined module generators capable of generating layouts for one or more modules of the circuit design (operation 304). Next, the system can create a layout for the circuit design using the schematic, the set of constraints, and the set of user-defined module generators (operation 306).

Figure 4:
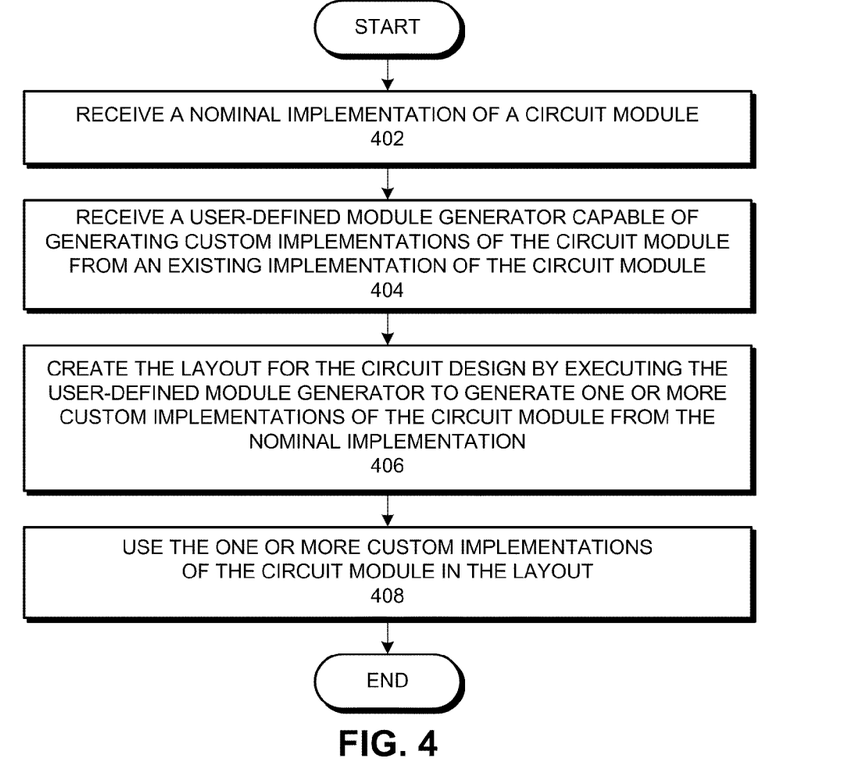
FIG. 4 presents a flow-chart illustrating a process for creating a layout for a circuit design in accordance with some embodiments of the present invention.

FIG. 4 presents a flow-chart illustrating a process for creating a layout for a circuit design in accordance with some embodiments of the present invention. The system can begin by receiving a nominal implementation of a circuit module (operation 402), and receiving a user-defined module generator capable of generating one or more custom implementations of the circuit module from an existing implementation of the circuit module (operation 404). Then, the system can create the layout for the circuit design by executing the user-defined module generator on at least one processor to generate one or more custom implementations of the circuit module from the nominal implementation (operation 406). Specifically, the user-defined module generator can modify the nominal implementation to generate one or more custom implementations that satisfy a set of constraints. Note that in some embodiments, the one or more custom implementations of the circuit module can have different areas and leakage powers. The system can then use the one or more custom implementations of the circuit module in the layout (operation 408).

Figure 5:
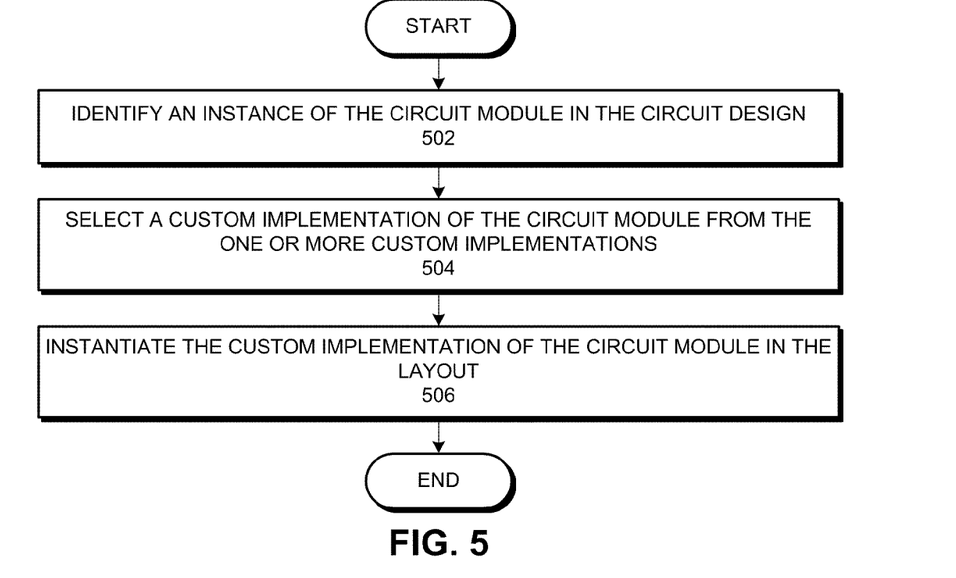
FIG. 5 presents a flow-chart illustrating a process for instantiating a custom implementation of a circuit module in a circuit layout in accordance with some embodiments of the present invention.

FIG. 5 presents a flow-chart illustrating a process for instantiating a custom implementation of a circuit module in a circuit layout in accordance with some embodiments of the present invention.

The system can begin by identifying an instance of the circuit module in the circuit design (operation 502). Next, the system can select a custom implementation of the circuit module from the one or more custom implementations (operation 504). Specifically, the system may select the custom implementation based on a variety of factors, including, but not limited to, timing, area, power, etc. Then, the system can instantiate the custom implementation of the circuit module in the layout (operation 506). Note that the process illustrated in FIG. 5 may be performed during place and route.

Figure 6:
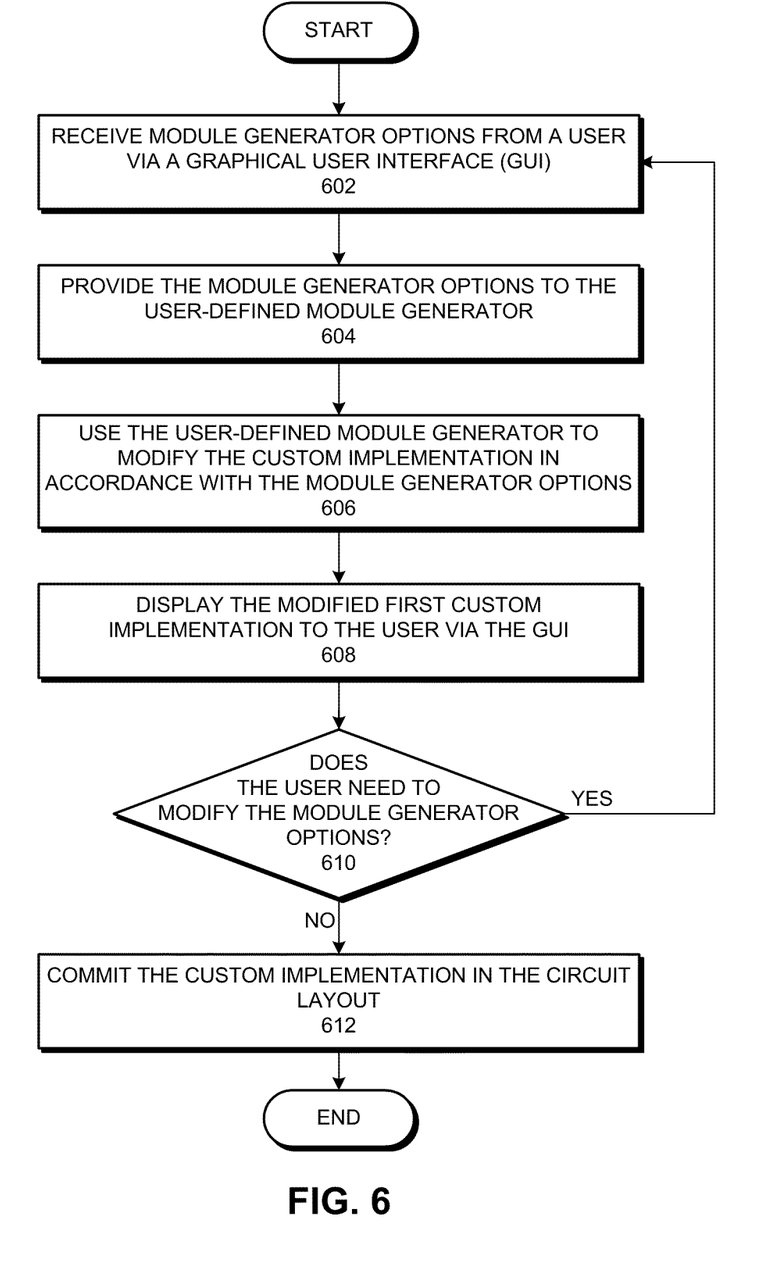
FIG. 6 presents a flow-chart illustrating a process for creating a layout for a circuit design in accordance with some embodiments of the present invention.

FIG. 6 presents a flow-chart illustrating a process for creating a layout for a circuit design in accordance with some embodiments of the present invention.

The system can begin by receiving module generator options from a user via a graphical user interface (GUI) (operation 602). Next, the system can provide the module generator options to the user-defined module generator (operation 604). Then, the user-defined module generator can modify the custom implementation in accordance with the module generator options (operation 606). The system can then display the modified custom implementation to the user via the GUI (operation 608). The user can decide whether the module generator options need to be modified (operation 610). If the user wants to use different options, the system can return to operation 602 to receive the new module generator options from the user. Otherwise, if the user does not desire to modify the module generator options, the system can commit the custom implementation in the circuit layout (operation 612).

The system can create and manipulate a design using OpenAccess which defines a standardized data model and interface for representing and accessing the design. Specifically, in some embodiments, the system can include the following components: an OpenAccess (OA) design, a tool command language (Tcl) access application programming interface (API), a GUI, and a runtime rendering mechanism.

Internally, the system can store the design using a proprietary representation, and provide a mechanism for converting the design from the internal representation to the OA design, and vice versa. Since the system maintains the design in OA, it enables third parties to provide user-defined module generators that can operate on the OA design. For example, a custom module generator can include an entry Tcl procedure that accepts an OA design representation and an Options object as input. Then, the module generator can perform placement and routing to generate a circuit layout for the circuit module based on the options specified in the Options object. The module generator can also interact with the circuit layout system via a rich set of Tcl access APIs to access additional design constraints and design information for a circuit design. Once the module generator completes modifying the OA design representation, the module generator can then pass the modified OA design representation back to the circuit layout system for further processing.

Circuit designers typically describe their design intent using design constraints. In some embodiments of the present invention, the system provides two options for the user to access design constraints. The first option is to annotate the temporary OA design with design constraints by using standard OA constraint objects. However, it may be difficult if not impossible to annotate some design constraints using this approach. Hence, some embodiments provide a second option which involves using APIs (e.g., Tcl APIs) to access design constraints.

A custom module generator can use a plurality of user controls and options to generate a circuit layout that satisfies technology constraints as well as the user's design intent. In some embodiments, the circuit layout system provides an intuitive and convenient GUI that enables a user to set or modify these controls and options at runtime.

Figure 7:
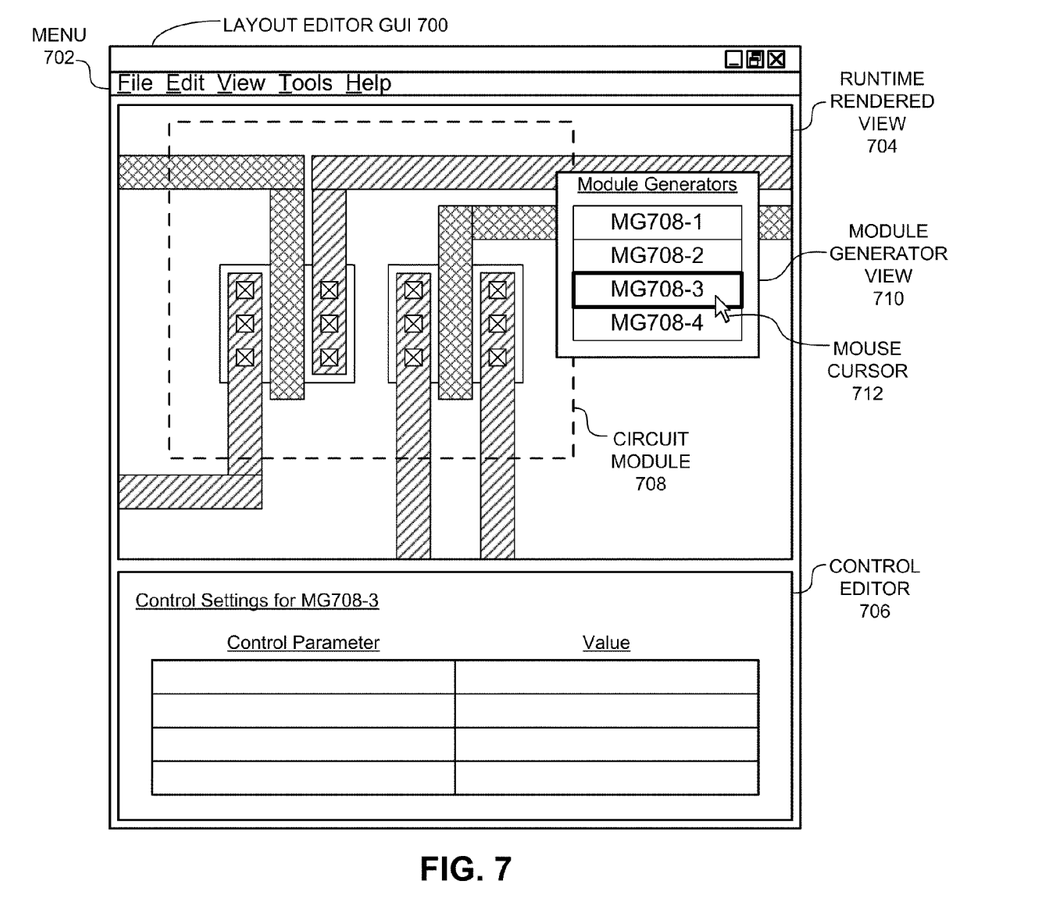
FIG. 7 illustrates a GUI that receives module generator controls/options from a user in accordance with some embodiments of the present invention.

FIG. 7 illustrates a GUI that receives module generator controls/options from a user in accordance with some embodiments of the present invention.

Layout editor GUI 700 can include a menu 702, a runtime rendered view 704, and a control/option editor 706. During operation, a user can use a mouse cursor 712 to select a circuit module 708 of a circuit design that the user desires to customize. In response to the user selecting module 708, GUI 700 may present the user with a module generator view 710, which provides the user with a set of module generators that the user can select for generating a custom layout for module 708.

Next, the user can select a module generator (e.g., module generator 708-3) from module generator view 710. In response to the user selecting module generator 708-3, control/option editor 706 can provide the user with mechanisms for setting controls/options for module generator 708-3. Alternatively, the system may use the default controls/options to generate the layout for the module, and allow the user to change the default controls/options via control/option editor 706.

A user can provide instructions for creating a GUI object (e.g., a Tcl procedure) with a module generator. When the module generator is executed, the system can use the GUI object to present controls/options to the user.

Runtime rendered view 704 can generate a circuit layout visualization as the user alters controls and options in control/option editor 706 so that the runtime rendered view 704 illustrates the effects that the user's modifications have on the module's layout. Thus, runtime rendered view 704 can provide a near-immediate feedback to the user to help the user adjust the controls/options for module generator 708-3 via control editor 706 until the user is satisfied with the layout.

The circuit layout system can also include a generator managing mechanism which, among other things, registers and executes module generators. For example, the generator manager may support the following Tcl API function to enable a user to register a module generator:

--- sdl::registerGenerator <generatorTclProcName> [-optionSet <Options object>]
    [-gui <generatorGUITclProcName>].

---

The function "sdl::registerGenerator" takes one required argument and two optional arguments. The required argument (shown as "generatorTclProcName") is the name of the module generator. This is the name that will be presented in module generator view 710. The first optional argument (shown as "-optionSet <Options object>") can be used to provide a set of options to the module generator. The second optional argument (shown as "-gui <generatorGUITclProcName>") can be used to provide a Tcl procedure which when executed during runtime presents a control/option window to the user.

The generator manager can also provide other functionality that is required for supporting third party module generators. For example, the generator manager can be responsible for creating a temporary OA design from the internal representation; executing the appropriate module generator on the temporary OA design; converting the modified module generator back to the internal representation; and freeing up any resources used by the temporary OA design once the module generation task is completed.

Figure 8:
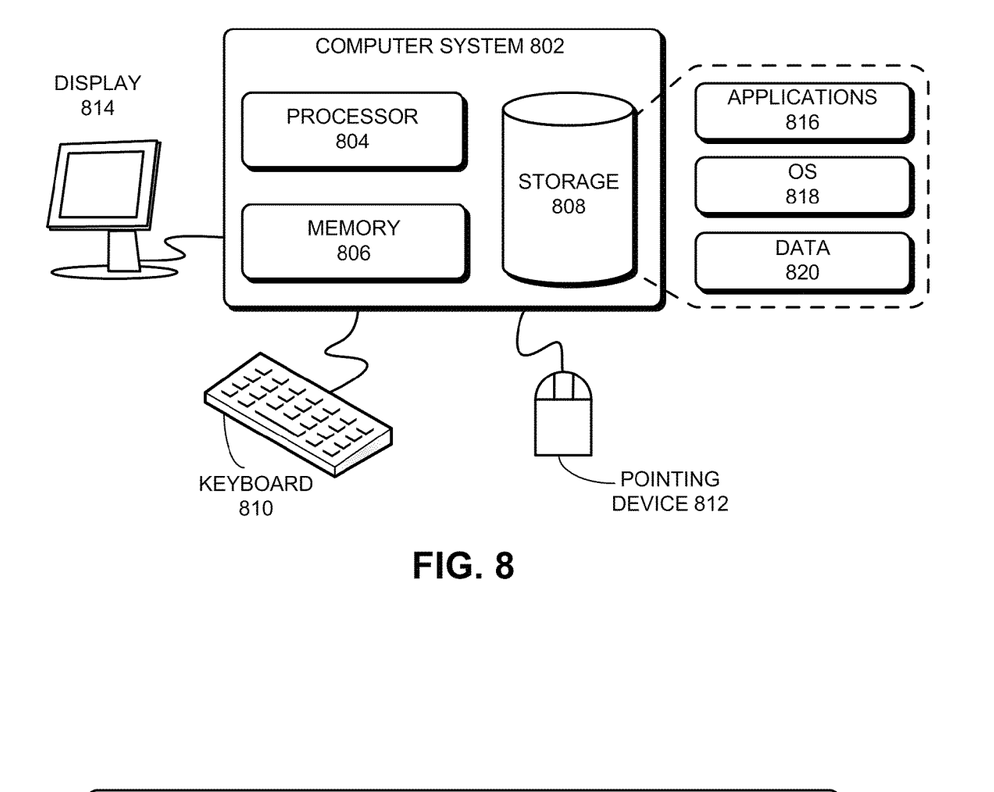
FIG. 8 illustrates a computer system in accordance with some embodiments of the present invention.

FIG. 8 illustrates a computer system in accordance with some embodiments of the present invention.

Computer system 802 includes a processor 804, a memory 806, and a storage device 808. Furthermore, computer system 802 can be coupled to a display device 814, a keyboard 810, and a pointing device 812. Storage device 808 can store operating system 818, applications 816, and data 820.

Applications 816 can include instructions, which when executed by computer system 802, can cause computer system 802 to perform methods and/or processes described in this disclosure. Data 820 can include any data that is required as input or that is generated as output by the methods and/or processes described in this disclosure. Specifically, data 818 can store, among other things, the circuit design, the module generators, and the set of design constraints.

Figure 9:
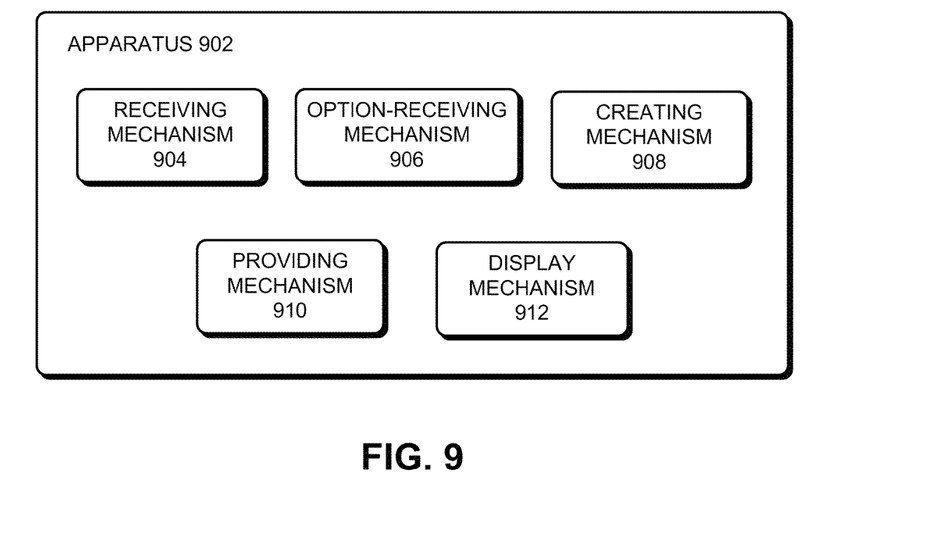
FIG. 9 illustrates an apparatus in accordance with some embodiments of the present invention.

FIG. 9 illustrates an apparatus in accordance with some embodiments of the present invention.

Apparatus 902 can comprise a plurality of mechanisms which may communicate with one another via a wired or wireless communication channel. Apparatus 902 may be realized using one or more integrated circuits, and apparatus 902 may include fewer or more mechanisms than those shown in FIG. 9. Further, apparatus 902 may be integrated in a computer system, or it may be realized as a separate device which is capable of communicating with other computer systems and/or devices. Specifically, apparatus 902 can comprise a receiving mechanism 904, an option-receiving mechanism 906, a creating mechanism 908, a providing mechanism 910, and a display mechanism 912.

In some embodiments, receiving mechanism 904 may be configured to receive a nominal implementation of the circuit module and a user-defined module generator capable of generating one or more custom implementations of the circuit module from an existing implementation of the circuit module. Moreover, option-receiving mechanism 906 may be configured to receive module generator options from a user.

Creating mechanism 908 may be configured to create the layout for the circuit design, which involves using the user-defined module generator to generate one or more custom implementations of the circuit module from the nominal implementation, and using the one or more custom implementations of the circuit module in the layout. Providing mechanism 910 may be configured to provide the module generator options to the user-defined module generator so that the user-defined module generator modifies a custom implementation in accordance with the module generator options. Display mechanism 912 may be configured to display the modified custom implementation to the user.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a non-transitory computer-readable storage medium and/or a hardware module and/or hardware apparatus. A non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a non-transitory computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer-implemented method for creating a layout for a circuit design which includes a circuit module, the method comprising:

receiving a user-defined module generator to generate at least one custom implementation of the circuit module from an existing implementation of the circuit module; and creating the layout for the circuit design by:

converting the existing implementation from an internal representation of the existing implementation of the circuit module to an open representation of the existing implementation of the circuit module, wherein the open representation of the existing implementation of the circuit module is a standardized data model and interface for representing and accessing the existing implementation of the circuit module;

executing the user-defined module generator on at least one processor to generate at least one open representation of a custom implementation of the circuit module from the open representation of the existing implementation of the circuit module, wherein the user-defined module generator generates the open representation of the custom implementation of the circuit module by modifying the open representation of the existing implementation of the circuit module to satisfy a set of constraints;

converting the custom implementation of the circuit module from the open representation of the custom implementation of the circuit module to an internal representation of the custom implementation of the circuit module; and instantiating the internal representation of the custom implementation of the circuit module in the layout.

2. The method of claim 1, wherein creating the layout for the circuit design includes:

receiving module generator options from a user via a graphical user interface (GUI); and providing the module generator options to the user-defined module generator so that the user-defined module generator modifies a first custom implementation in accordance with the module generator options.

3. The method of claim 2, wherein creating the layout for the circuit design includes displaying the modified first custom implementation to the user via the GUI.

4. The method of claim 1, wherein the user-defined module generator performs module-level placement and routing.

5. The method of claim 1, wherein the one or more custom implementations of the circuit module have different areas and leakage powers.

6. A non-transitory computer-readable storage medium storing instructions that when executed by a computer cause the computer to perform a method for creating a layout for a circuit design which includes a circuit module, the method comprising:

receiving a user-defined module generator to generate at least one custom implementation of the circuit module from an existing implementation of the circuit module; and creating the layout for the circuit design by:

converting the existing implementation from an internal representation of the existing implementation of the circuit module to an open representation of the existing implementation of the circuit module, wherein the open representation of the existing implementation of the circuit module is a standardized data model and interface for representing and accessing the existing implementation of the circuit module;

executing the user-defined module generator on one or more processors to generate at least one open representation of a custom implementations of the circuit module from the open representation of the existing implementation of the circuit module, wherein the user-defined module generator generates the open representation of the custom implementation of the circuit module by modifying the open representation of the existing implementation of the circuit module to satisfy a set of constraints;

converting the custom implementation of the circuit module from the open representation of the custom implementation of the circuit module to an internal representation of the custom implementation of the circuit module; and instantiating the internal representation of the custom implementation of the circuit module in the layout.

7. The non-transitory computer-readable storage medium of claim 6, wherein creating the layout for the circuit design includes:

receiving module generator options from a user via a graphical user interface (GUI); and providing the module generator options to the user-defined module generator so that the user-defined module generator modifies a first custom implementation in accordance with the module generator options.

8. The non-transitory computer-readable storage medium of claim 7, wherein creating the layout for the circuit design includes displaying the modified first custom implementation to the user via the GUI.

9. The non-transitory computer-readable storage medium of claim 6, wherein the user-defined module generator performs module-level placement and routing.

10. The non-transitory computer-readable storage medium of claim 6, wherein the one or more custom implementations of the circuit module have different areas and leakage powers.

11. An apparatus for creating a layout for a circuit design which includes a circuit module, comprising:

a receiving mechanism configured to receive a user-defined module generator to generate at least one custom implementation of the circuit module from an existing implementation of the circuit module; and a creating mechanism configured to create the layout for the circuit design by:

converting the existing implementation from an internal representation of the existing implementation of the circuit module to an open representation of the existing implementation of the circuit module, wherein the open representation of the existing implementation of the circuit module is a standardized data model and interface for representing and accessing the existing implementation of the circuit module;

executing the user-defined module generator to generate at least one open representation of a custom implementation of the circuit module from the open representation of the existing implementation of the circuit module, wherein the user-defined module generator generates the open representation of the custom implementation of the circuit module by modifying the open representation of the existing implementation of the circuit module to satisfy a set of constraints;

converting the custom implementation of the circuit module from the open representation of the custom implementation of the circuit module to an internal representation of the custom implementation of the circuit module; and instantiating the internal representation of the custom implementation of the circuit module in the layout.

12. The apparatus of claim 11, wherein the apparatus further includes:

an option-receiving mechanism configured to receive module generator options from a user; and a providing mechanism configured to provide the module generator options to the user-defined module generator so that the user-defined module generator modifies a first custom implementation in accordance with the module generator options.

13. The apparatus of claim 12, wherein the apparatus further includes a display mechanism configured to display the modified first custom implementation to the user.

14. The apparatus of claim 11, wherein the user-defined module generator performs module-level placement and routing.

15. The apparatus of claim 11, wherein the one or more custom implementations of the circuit module have different areas and leakage powers.

* * * * *